(12) United States Patent
Frasch et al.

(10) Patent No.: US 10,224,887 B2
(45) Date of Patent: Mar. 5, 2019

(54) VARIABLE GAIN-BANDWIDTH TRANSIMPEDANCE AMPLIFIER

(71) Applicant: Analog Devices, Inc., Norwood, MA (US)

(72) Inventors: Zoltan Frasch, Hooksett, NH (US); Mahmoud Belaid, Woburn, MA (US)

(73) Assignee: Analog Devices, Inc., Norwood, MA (US)

( * ) Notice: Subject to any disclaimer, the term of this patent is extended or adjusted under 35 U.S.C. 154(b) by 15 days.

(21) Appl. No.: 15/669,466

(22) Filed: Aug. 4, 2017

(65) Prior Publication Data

US 2019/0044489 A1 Feb. 7, 2019

(51) Int. Cl.
*H03F 3/45* (2006.01)
*H03F 1/26* (2006.01)
*G01M 11/00* (2006.01)

(52) U.S. Cl.
CPC ..... *H03F 3/45475* (2013.01); *G01M 11/3145* (2013.01); *H03F 1/26* (2013.01); *H03F 2200/372* (2013.01); *H03F 2203/45702* (2013.01)

(58) Field of Classification Search
CPC ....................................................... H03F 3/454
See application file for complete search history.

(56) References Cited

U.S. PATENT DOCUMENTS

| | | | |
|---|---|---|---|
| 5,432,474 A | 7/1995 | Lauffenburger et al. | |
| 7,323,930 B2 | 1/2008 | Aram et al. | |
| 7,586,372 B1 | 9/2009 | Voo | |
| 7,737,777 B2 | 6/2010 | Aram et al. | |
| 8,773,199 B2 | 7/2014 | Wan | |
| 9,419,573 B2 | 8/2016 | Brekelmans | |
| 9,590,579 B2 | 3/2017 | Carter et al. | |
| 9,590,801 B1 | 3/2017 | Shringarpure et al. | |

FOREIGN PATENT DOCUMENTS

EP 2961063 A1 12/2015

OTHER PUBLICATIONS

"Trans-Impedance Amplifier (TIA) 1.60", Cypress Semiconductor Corp, Document No. 001-65714 Rev., (2010), 12 pgs.
"Ultralow Distortion, High Speed, 0.95 nV/vHz. Voltage Noise Op Amp", Analog Devices Data Sheet AD8099, (2016), 28 pgs.
Orozco, Luis, "Programmable-Gain Transimpedance Amplifiers Maximize Dynamic Range in Spectroscopy Systems", AnalogDialogue, vol. 47, [Online]. Retrieved from the Internet: www.analog.com/en/analog-dialogue/articles/programmable</, (Accessed Jul. 31, 2017), 32 pgs.

*Primary Examiner* — Patricia T Nguyen
(74) *Attorney, Agent, or Firm* — Schwegman Lundberg & Woessner, P.A.

(57) ABSTRACT

A transimpedance amplifier (TIA) can include an operational amplifier with a programmable compensation capacitor, such as can be used for compensating first transconductance stage of an operational amplifier circuit that can be used in a TIA configuration. This technique is particularly suitable, for example, for an Optical Time Domain Reflectometer (OTDR) application, which can use variable pulsewidth launch pulses. Based on the pulsewidth of such launch pulses, the bandwidth of an operational amplifier of the TIA can be adjusted, such as to decrease the signal and noise bandwidth when relatively wider pulses are to be used, to improve the noise performance for such wider pulses, and to increase the signal and noise bandwidth when relatively narrower pulses are to be used.

20 Claims, 1 Drawing Sheet

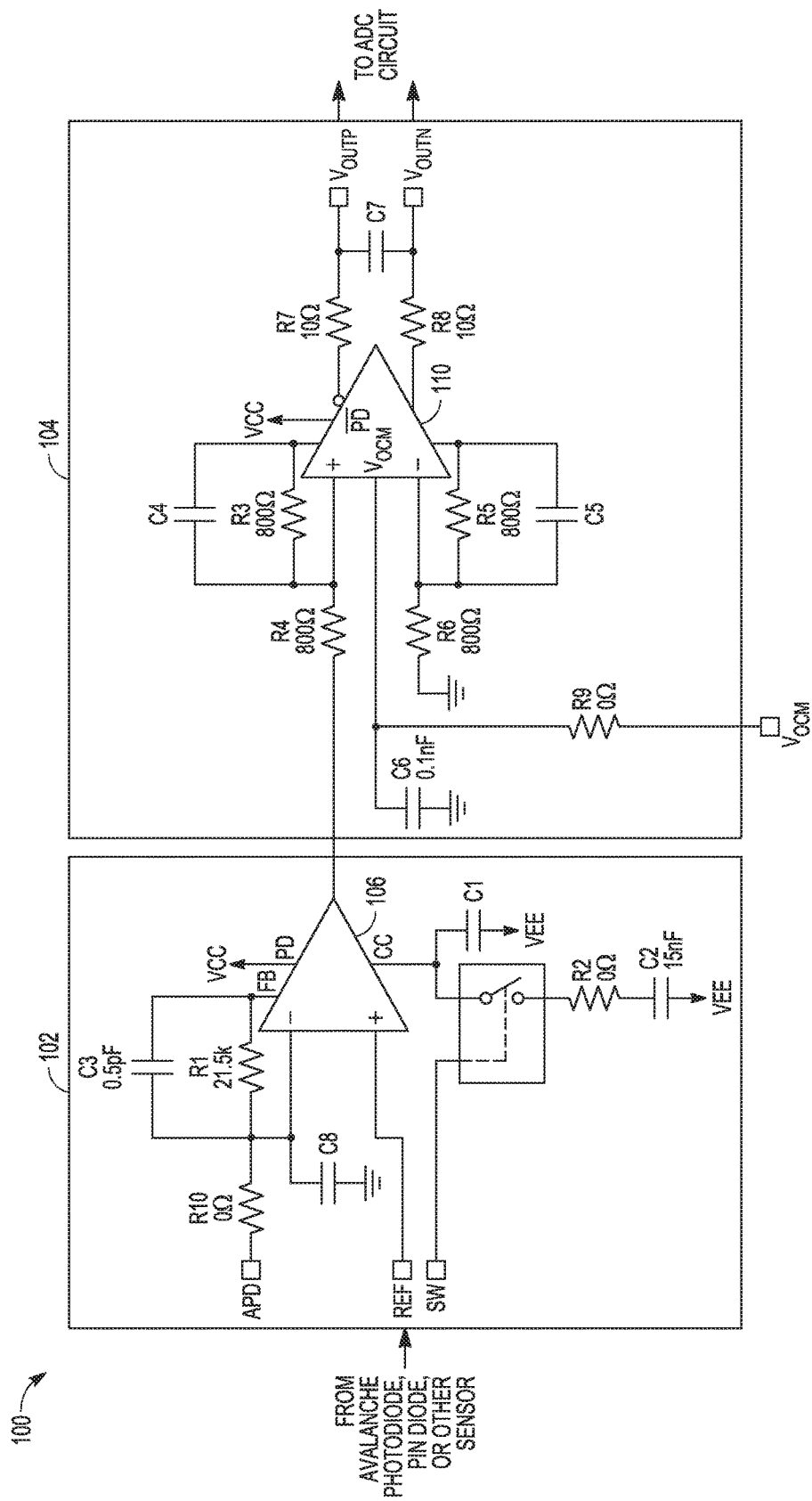

US 10,224,887 B2

VARIABLE GAIN-BANDWIDTH TRANSIMPEDANCE AMPLIFIER

TECHNICAL FIELD

This document pertains generally, but not by way of limitation, to integrated circuit electronics and more particularly, but not by way of limitation to a variable gain-bandwidth transimpedance amplifier, such as for use as an analog front-end interface to an avalanche or PIN photodiode before analog-to-digital signal conversion.

BACKGROUND

A photodiode is an example of a sensor that can produce a charge or current, which can be transformed into a signal voltage by a transimpedance amplifier (TIA), such as before analog-to-digital conversion (ADC) of the signal and further digital signal processing.

SUMMARY

The present inventors have recognized, among other things, that the frequency of the sensor signal received by a TIA can vary, such that reducing the bandwidth for slower signals can help reduce noise and increase signal-to-noise ratio (SNR) performance, particularly if it can be done without perturbing the signal gain. Accordingly, this document describes, among other things, a TIA with a programmable compensation capacitor, such as can be used for compensating first transconductance stage of an operational amplifier circuit that can be used in a TIA configuration.

This technique is particularly suitable, for example, for an Optical Time Domain Reflectometer (OTDR) application, which can use variable pulsewidth launch pulses. Based on the pulsewidth of such launch pulses, the bandwidth of an operational amplifier of the TIA can be adjusted, such as to decrease the signal and noise bandwidth when relatively wider pulses are to be used, to improve the noise performance for such wider pulses, and to increase the signal and noise bandwidth when relatively narrower pulses are to be used.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 1 shows an example of an analog front end (AFE) circuit such as can include a transimpedance amplifier (TIA) circuit.

DETAILED DESCRIPTION

The present inventors have recognized, among other things, that the frequency of the sensor signal received by a TIA can vary, such that reducing the bandwidth for slower signals can help reduce noise and increase signal-to-noise ratio (SNR) performance, particularly if it can be done without perturbing the signal gain. Accordingly, this document describes, among other things, a TIA with a programmable compensation capacitor, such as can be used for compensating first transconductance stage of an operational amplifier circuit that can be used in a TIA configuration.

This technique is particularly suitable, for example, for an Optical Time Domain Reflectometer (OTDR) application, which can use variable pulsewidth launch pulses. Based on the pulsewidth of such launch pulses, the bandwidth of an operational amplifier of the TIA can be adjusted, such as to decrease the signal and noise bandwidth when relatively wider pulses are to be used, to improve the noise performance for such wider pulses, and to increase the signal and noise bandwidth when relatively narrower pulses are to be used.

FIG. 1 shows an example of an analog front end (AFE) circuit 100 such as can receive a sensor input signal, such as a charge or current produced by a pin diode or avalanche photodiode or the like. The AFE circuit 100 can include a transimpedance amplifier (TIA) 102 circuit, such as can receive a charge or current signal from an avalanche photodiode (APD), a pin diode (PD), or another sensor or circuit. The TIA 102 can produce a single-ended output voltage signal, such as can be provided to an input of a single-ended-to-differential voltage amplifier 104 circuit, which, in turn, can provide a differential output voltage signal to an analog-to-digital converter (ADC) circuit, such as for conversion into a digital signal, which can optionally undergo digital signal processing.

The TIA 102 can include an operational amplifier 106 (e.g., AD8099 from Analog Devices, Inc.) with an inverting input electrically coupled to the sensor input at node APD to receive an input signal, such as through a parasitic or other resistance R10. A gain resistance R1 (e.g., 21.5 KΩ in a high-gain mode, 16.5 KΩ in a low-gain mode) can be coupled in a feedback path from an output of the operational amplifier 106 to its inverting input, such as in parallel with a feedback capacitor C3 (e.g., 0.5 pF). The non-inverting input of the operational amplifier 106 can include a parasitic resistance, which is represented by C8 in FIG. 1. The inverting input of the operational amplifier 106 can be coupled to a reference voltage, REF, such as +1V, such as when the operational amplifier 106 is powered by VCC=+5V and VEE=−5V. A compensation capacitor can be coupled to a compensation input of the operational amplifier 106, such as to be connected to an output of a transconductance first stage within the operational amplifier 106 and to an input of a buffer second stage within the operational amplifier 106, such as to compensate the operational amplifier 106 by introducing a dominant pole for compensating the a transconductance first stage within the operational amplifier 106. As shown in FIG. 1, the compensation capacitor can be programmable to include one or more selectable capacitors, such as C1 and C2 shown in FIG. 1. A control signal SW can be provided to an input terminal of a switch 108 (such as ADG751 analog switch from Analog Devices, Inc.), which can be used to selectively switch C2 in parallel with C1. In an example, C2 can have a capacitance value of 15 nF, which can be switched in parallel with C1, which, in an example, can constitute a parasitic capacitance, rather than an actual capacitor component. When the user expects to receive lower frequency signals at APD, the capacitance C2 can be switched into parallel with C1 to cut the signal and noise bandwidth of the operational amplifier 106, while maintaining the transimpedance gain of the TI 102 such as by optionally leaving the resistance value of R1 unchanged. This can improve the noise performance at lower frequencies. More than two levels of control can be provided if desired, such as by implementing C2 as a programmable capacitance array, such as can be controlled by a digital control signal.

The single-ended-to-differential voltage amplifier 104 can include a differential input and differential output operational amplifier 110 (such as ADA4930 from Analog Devices Inc.), a non-inverting input of which can be coupled to the output of the TIA 102, such as through a resistor R4 (e.g., 800Ω). An inverting input of the operational amplifier 110 can be coupled to a reference voltage such as ground, such as through a resistor R6 (e.g., 800Ω). The positive output of the operational amplifier 110 can be fed back to its non-inverting input terminal, such as via feedback resistor R3 (e.g., 800Ω), which can appear in parallel with a parasitic capacitor C4 or actual capacitor C4. The negative output of the operational amplifier 110 can be fed back to its inverting input terminal, such as via feedback resistor R5 (e.g., 800Ω), which can appear in parallel with a parasitic capacitor C5 or actual capacitor C5. The operational amplifier 110 can include a common mode input, such as can be biased with a common mode bias voltage, Vocm, such as can have a value of +1V, in an example. A stabilizing capacitor C6 (e.g., 0.1 μF) can be connected between the common mode input of the operational amplifier 110 and a ground node, such as to help maintain a stable common mode bias voltage for the operational amplifier 110. Parasitics at the output of the operational amplifier 110 are represented by the resistors R7, R8, and C7, such as shown in FIG. 1.

As explained above, the TIA 102 can provide a constant transimpedance, variable bandwidth TIA, such as can be suitable for various different applications, in particular for an Optical Time Domain Reflectometer (OTDR) application, which can use variable pulsewidth launch pulses. Based on the pulsewidth of such launch pulses, the bandwidth of the operational amplifier 106 of the TIA 102 can be adjusted, such as to decrease the signal and noise bandwidth when relatively wider pulses are to be used, to improve the noise performance for such wider pulses, and to increase the signal and noise bandwidth when relatively narrower pulses are to be used. As explained above, the TIA gain-bandwidth product (GBWP) can be varied such as by programmably varying the capacitance value of the compensation capacitance that is electrically coupled to the compensation capacitor pin of the operational amplifier 106, such as to alter the dominant pole compensating the first stage (transconductance stage) of the operational amplifier 106.

Given a finite input capacitance, a TIA-feedback resistor combination can be selected such that the bandwidth of the operational amplifier 106 is just sufficient for the narrowest pulse, e.g., of the OTDR application. As the pulsewidth increases the GBWP of the operational amplifier 106 can be reduced by switching in, or adding to the capacitance value of, a compensation capacitor. This approach can reduce the needed number of samples to be averaged for wider pulses, thereby improving acquisition time.

This variable bandwidth TIA approach can be compared to and contrasted with an approach relying upon a switched gain TIA, which divides the total dynamic range into zones of increased gain. In a switched gain TIA approach, one or more lower resistance value feedback resistors can be switched in parallel with the highest feedback resistor to lower the transimpedance of the TIA. This switched gain TIA topology may work for applications that require a large dynamic range and bandwidth at frequencies near DC, but can fall short in applications in which relatively high bandwidth needs to be maintained. With a constant input capacitance, narrower pulses reduce the input current to the TIA. To compensate, a higher value feedback resistor is switched in, which reduces the bandwidth when the variable gain TIA approach is used. Users of this approach would hope that the input capacitance can be lowered until the reduction of bandwidth with increasing gain becomes insignificant. This, however, can be incompatible with certain applications.

By contrast, the present approach can hold the transimpedance gain constant, such as at a value that can be selected or optimized for the highest desired bandwidth, and can instead reduce the GBWP of the operational amplifier 106 used in the TIA 102 by switching in or adding capacitance to an external compensation capacitor connected to the compensation capacitor pin for the operational amplifier 106.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment.

The claimed invention is:

1. An analog front-end circuit for interfacing with a sensor to provide an adjustable signal and noise bandwidth for improving a signal-to-noise characteristic of a sensor-derived signal, the analog front-end circuit comprising:
   a transimpedance amplifier, including an operational amplifier and a feedback resistor, the operational amplifier including a compensation input for switchably receiving a programmable compensation capacitor for changing a gain-bandwidth product of the transimpedance amplifier without requiring altering the gain of the transimpedance amplifier.

2. The analog front-end circuit of claim 1, comprising:
   a switch, coupled to the compensation input of the operational amplifier;
   and wherein the compensation capacitor includes a first compensation capacitance value, coupled to the compensation input of the operational amplifier when the switch is in a first switch state, and a second compensation capacitance value, coupled to the compensation input of the operational amplifier when the switch is in a second switch state.

3. The analog front-end circuit of claim 1, wherein the programmable compensation capacitor is configured such that adjusting a capacitance value of the programmable compensation capacitor adjusts a pole frequency of a dominant pole within the operational amplifier.

4. The analog front-end circuit of claim 1, wherein the programmable compensation capacitor is configured such that adjusting a capacitance value of the programmable compensation capacitor adjusts a frequency characteristic of an input transconductance stage circuit within the operational amplifier.

5. The analog front-end circuit of claim 1, further comprising a feedback capacitor coupled in parallel with the feedback resistor between an output of the operational amplifier and an inverting input of the operational amplifier.

6. The analog front-end circuit of claim 1, in combination with a single-ended-to-differential voltage amplifier circuit coupled to receive a signal from the output of the operational amplifier of the transimpedance amplifier circuit.

7. The analog front-end circuit of claim 6, in combination with an analog-to-digital converter circuit coupled to receive a differential input signal from respective outputs of the voltage amplifier circuit.

8. The analog front-end circuit of claim 7, in combination with a sensor configured for an Optical Time Domain Reflectometer (OTDR) application.

9. The analog front-end circuit of claim 1, in which the compensation capacitor is adjustable based on a pulsewidth of adjustable pulsewidth pulses used in an Optical Time Domain Reflectometer (OTDR) including or coupled to the analog front-end circuit.

10. The analog front-end circuit of claim 1, in which the compensation capacitor includes a digitally programmable capacitor array.

11. A method of interfacing with a sensor to receive variable pulsewidth pulses of a signal, the method comprising:
    for a relatively lower frequency or longer pulsewidth pulse, amplifying the signal with a first gain and a first bandwidth determined by an adjustable compensation capacitor compensating an operational amplifier; and
    for a relatively higher frequency or shorter pulsewidth pulse, amplifying the signal with the first gain and a second bandwidth determined by the adjustable compensation capacitor compensating the operational amplifier, wherein the second bandwidth is made larger than the first bandwidth by adjusting the capacitance value of the compensation capacitance compensating a compensation input of the operational amplifier.

12. The method of claim 11, comprising:
    switching a compensation capacitance value, coupled to the compensation input of the operational amplifier, to provide a first compensation capacitance value, coupled to the compensation input of the operational amplifier when a switch is in a first switch state, and a second compensation capacitance value, coupled to the compensation input of the operational amplifier when the switch is in a second switch state.

13. The method of claim 11, comprising adjusting the compensation capacitor so as to adjust a pole frequency of a dominant pole within the operational amplifier.

14. The method of claim 13, wherein adjusting a capacitance value of the programmable compensation capacitor adjusts a frequency characteristic of an input transconductance stage circuit within the operational amplifier.

15. The method of claim 11, further comprising providing a transimpedance amplification of a sensor signal.

16. The method of claim 15, comprising converting a transimpedance output from a single-ended to a differential signal.

17. The method of claim 16, comprising converting the differential signal from an analog signal into a digital signal.

18. The method of claim 11, comprising performing optical time domain reflectometry (OTDR) including using an adjustable compensation capacitance value for adjusting a frequency characteristic of an operational amplifier in a transimpedance amplifier based on a pulsewidth of OTDR pulses.

19. An analog front-end circuit for interfacing with a sensor to provide an adjustable signal and noise bandwidth for improving a signal-to-noise characteristic of a sensor-derived signal, the analog front-end circuit comprising:
    a transimpedance amplifier, including an operational amplifier and a feedback resistor, the operational amplifier including a compensation input for switchably receiving a programmable compensation capacitor for changing a gain-bandwidth product of the transimpedance amplifier without requiring altering the gain of the transimpedance amplifier;

a switch, coupled to the compensation input of the operational amplifier;

and wherein the compensation capacitor includes a first compensation capacitance value, coupled to the compensation input of the operational amplifier when the switch is in a first switch state, and a second compensation capacitance value, coupled to the compensation input of the operational amplifier when the switch is in a second switch state, wherein the programmable compensation capacitor is configured such that adjusting a capacitance value of the programmable compensation capacitor adjusts a pole frequency of a dominant pole within the operational amplifier, including adjusting a frequency characteristic of an input transconductance stage circuit within the operational amplifier; and wherein the analog front-end circuit is included in combination with a sensor configured for an Optical Time Domain Reflectometer (OTDR) application.

20. The analog front-end circuit of claim 19, in which the compensation capacitor is adjustable based on a pulsewidth of adjustable pulsewidth pulses used in an Optical Time Domain Reflectometer (OTDR) including or coupled to the analog front-end circuit.

* * * * *